(12) United States Patent
Queck et al.

(10) Patent No.: US 9,590,498 B2
(45) Date of Patent: Mar. 7, 2017

(54) HIGH SIDE SWITCH FOR SELECTIVELY SUPPLYING POWER FROM A POWER SUPPLY TO A LOAD

(71) Applicant: Lear Corporation, Southfield, MI (US)

(72) Inventors: Marian Queck, Steinach (DE); Volker Marr, Ebersdorf (DE); Fried Berkenkamp, Allmersbach (DE)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 14/587,674

(22) Filed: Dec. 31, 2014

(65) Prior Publication Data

US 2016/0190919 A1 Jun. 30, 2016

(51) Int. Cl.
*H02M 3/07* (2006.01)
*H03K 17/06* (2006.01)

(52) U.S. Cl.
CPC ............ *H02M 3/07* (2013.01); *H03K 17/063* (2013.01); *H03K 2217/0063* (2013.01); *H03K 2217/0081* (2013.01)

(58) Field of Classification Search
CPC ... H02M 1/08; H02M 2001/0096; H02M 3/07
See application file for complete search history.

(56) References Cited

U.S. PATENT DOCUMENTS

| | | | | | |
|---|---|---|---|---|---|
| 3,543,039 | A | * | 11/1970 | Jacques | F02N 11/105 123/179.3 |
| 3,757,145 | A | * | 9/1973 | Adam | G05F 3/205 257/E27.033 |
| 4,167,036 | A | * | 9/1979 | Kenney | F41B 15/04 231/7 |
| 5,672,992 | A | * | 9/1997 | Nadd | H02M 3/07 327/390 |
| 5,689,208 | A | * | 11/1997 | Nadd | H02M 3/07 327/390 |
| 5,744,943 | A | * | 4/1998 | Tokai | H02M 3/155 323/222 |
| 6,255,885 | B1 | * | 7/2001 | Brandt | H03F 1/301 327/309 |
| 7,098,633 | B1 | * | 8/2006 | Brokaw | H02M 1/08 323/222 |
| 8,558,584 | B2 | | 10/2013 | Draxelmayr et al. | |
| 2003/0058029 | A1 | * | 3/2003 | Matsui | H02M 3/07 327/536 |
| 2004/0227564 | A1 | * | 11/2004 | Mayama | H02M 3/07 327/536 |

(Continued)

*Primary Examiner* — Timothy J Dole
*Assistant Examiner* — Yusef Ahmed
(74) *Attorney, Agent, or Firm* — MacMillan, Sobanski & Rodd, LLC

(57) ABSTRACT

A circuit arrangement for selectively supplying power from a power supply to a load includes a semiconductor switch, such as an n-channel FET, along with a gate control and a charge pump. The circuit additionally includes a diode located in a ground path between a ground connection of the charge pump and a circuit ground, and a capacitor connected between the power supply and the diode. The added diode and capacitor allow the charge pump to maintain the FET in an ON state during a momentary voltage drop of the supply voltage. This circuit is preferably used with a high side switch integrated circuit.

5 Claims, 4 Drawing Sheets

(56) References Cited

U.S. PATENT DOCUMENTS

2006/0256592 A1* 11/2006 Yoshida ................ H02M 3/073
   363/59
2009/0261798 A1* 10/2009 Sachdev .............. H03K 17/302
   323/288
2013/0155742 A1* 6/2013 Lee ....................... H02M 7/103
   363/126

* cited by examiner

HIGH SIDE SWITCH FOR SELECTIVELY SUPPLYING POWER FROM A POWER SUPPLY TO A LOAD

BACKGROUND OF THE INVENTION

This invention relates in general to a high side switch for a field-effect transistor. In particular, this invention relates to controlling a voltage to a load through such a high side switch.

A transistor such as, e.g., a field-effect transistor (FET) may be used for amplifying or switching electronic signals. When used as a switch between a positive power supply and a load, a high side driver circuit is typically provided. The high side driver circuit contains control and power sub-circuits to operate the gate of the FET. The high side driver and the FET may optionally be included in one package as a high side switch integrated circuit (IC).

A high side switch may use an n-channel metal oxide semiconductor FET (MOSFET) or a p-channel MOSFET. An n-channel MOSFET may be preferable due to having a lower ON-resistance and better efficiency. An n-channel MOSFET switch normally requires a gate voltage higher than the voltage of the power supply to turn the switch on. The increased voltage may be provided by an internal charge pump included with the high side driver.

FIG. 1a shows a schematic representation of a typical prior art n-channel high side IC switch. The n-channel high side switch includes an input connected to drain D, which may also be the source of power for the control section of the switch. The output is controlled by a switching transistor, which may be an n-type MOSFET. A gate G is controlled by logic which is discrete or integrated in a controller IC. The logic may be applied to the gate using a boosted voltage from a charge pump. The charge pump may draw a low current from the VCC supply, which may be several milli-amps.

As shown in FIG. 1b, the charge pump may stop operating if the voltage supplied drops below an undervoltage threshold, shown at time t1. This may in turn cause the switch to turn off with the effect that the supplied load is switched off, even when the voltage drop occurs for just some milliseconds, such as shown in FIG. 1c, between time t1 and time t2. This may occur when the supply voltage drops due to, for example, increased drain on a battery that provides the supply voltage.

SUMMARY OF THE INVENTION

This invention relates to a circuit for operating a semiconductor switch such as a high-side n-channel FET switch wherein, in the event of a momentary voltage drop below the turn on voltage of the charge pump, the FET switch is maintained in an on state such that power continues to be supplied to a load.

According to one embodiment, a circuit arrangement for selectively supplying power from a power supply to a load comprises a semiconductor switch and a charge pump. The semiconductor switch is coupled to selectively open and close an electrical connection between the power supply and the load. The semiconductor switch has a control input for control of the switching thereof. The charge pump has an input adapted to be connected to the power supply, an output adapted to be selectively connected to the control input of the semiconductor switch, and a ground connection connected to a circuit ground through a ground path. The invention additionally provides a diode located in the ground path between the ground connection of the charge pump and the circuit ground, and a capacitor connected between the power supply and the diode. The added diode and capacitor allow the charge pump to maintain the semiconductor switch in an ON state during a momentary voltage drop of the supply voltage. The semiconductor switch may be an FET such as an n-channel MOSFET.

According to another embodiment, a circuit arrangement for selectively supplying power from a power supply to a load is used with a high side switch integrated circuit. The integrated circuit includes a semiconductor switch and an internal charge pump. The integrated circuit also has a supply terminal adapted to be connected the power supply, an output terminal adapted to be connected to the load, and a ground terminal. In this embodiment, a diode has an anode connected to the ground terminal of the integrated circuit and a cathode connected to a circuit ground. Further, a capacitor is connected between the power supply and the anode of the diode. The added diode and capacitor allow the charge pump to maintain the semiconductor switch in an ON state during a momentary voltage drop of the supply voltage. The semiconductor switch may be an FET such as an n-channel MOSFET.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 2A:
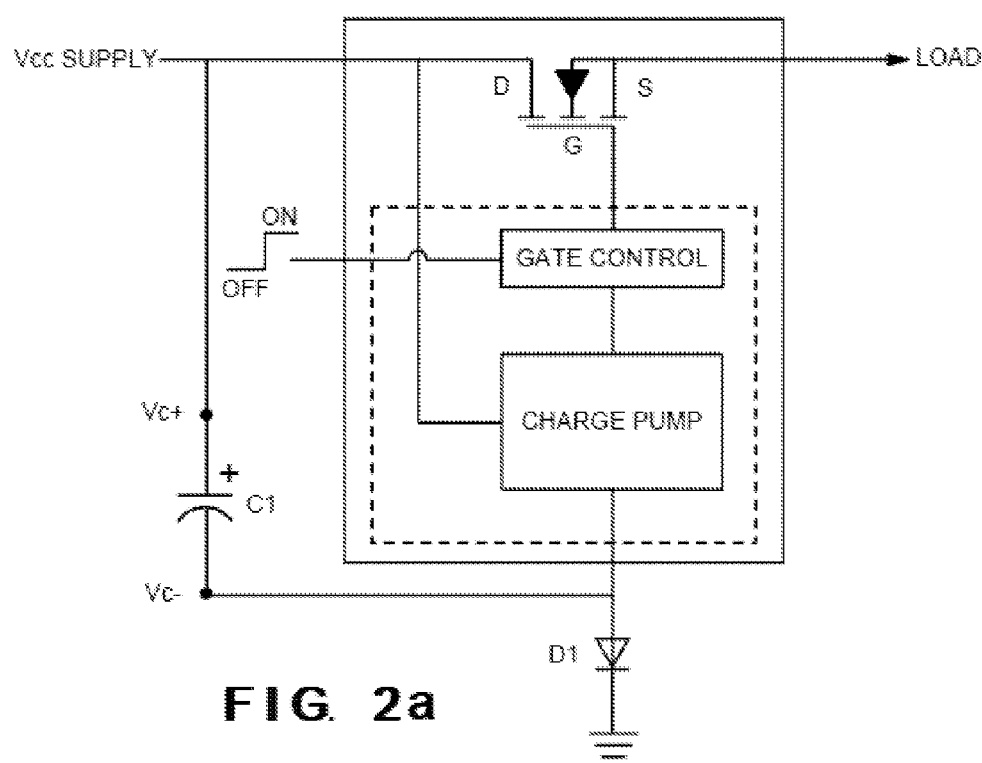
FIG. 2a is a schematic representation of an improved n-channel high side switch.

FIG. 2a represents an improved high side switch IC. There is a diode D1 that separates a capacitor C1 and a charge pump from ground potential. If Vcc were to suddenly drop to, e.g., half its value, the voltage at C1 Vcp(t) will be temporarily sustained while the potentials at the charge pump change according to:

$$Vcp(t) = \frac{1}{C1}\int_0^t I(t) + Vcp0,$$

where

Vcp0 is the voltage of the capacitor when the VCC voltage drop occurs

Vcp(t) is the voltage of the capacitor as function of time

I(t) is the current the charge pump needs and which is supplied by the capacitor The anode and cathode of capacitor C1 are represented by Vc+ and Vc− respectively. In the event of a voltage drop at Vc+, Vc− will equally drop in voltage, and Vc− may be a negative potential. The diode D1 will prevent current from traveling to Vc− from ground, so C1 will pull current from the charge pump until its bottom plate is a diode drop above ground potential. As a result, the previous Vcc voltage is temporarily held across C1 until its charge has been depleted by the high side driver. It is important to note that the voltage of Vcc is preserved, and not the potential itself. This requires the bottom plate of C1 to invert to a possibly negative voltage when Vcc is reduced, in order to maintain this voltage. The charge pump will continue to operate as long is its supply voltage is above the undervoltage threshold. The capacitance of C1 will determine the amount of charge stored in it during a Vcc dropout, and thus determine the amount of time the charge pump can operate until it shuts down.

Figure 1A:
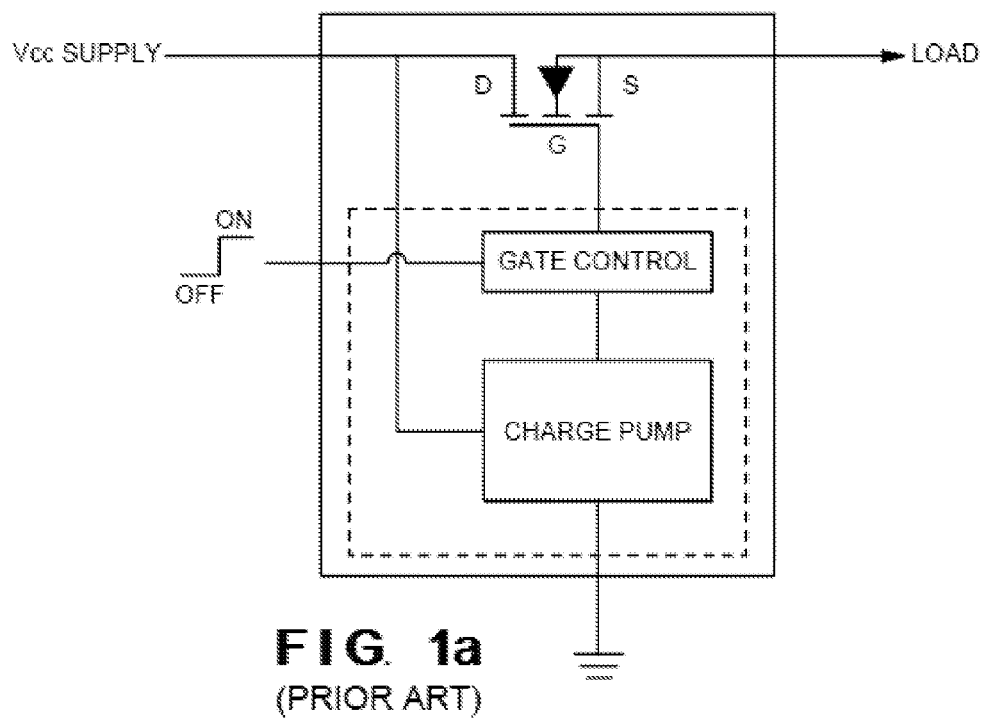
FIG. 1a is a schematic representation of a prior art n-channel high side switch.
Figure 1B:
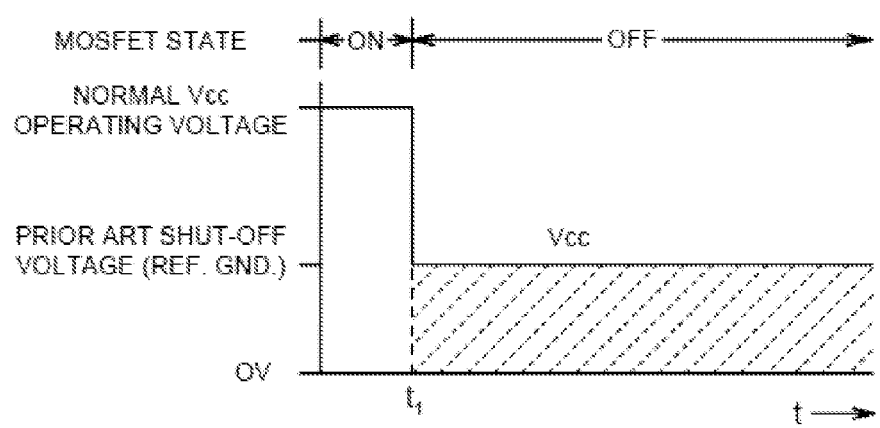
FIG. 1b is a plot of potential available for the prior art n-channel high side switch in the event of a lasting supply voltage drop out.
Figure 1C:
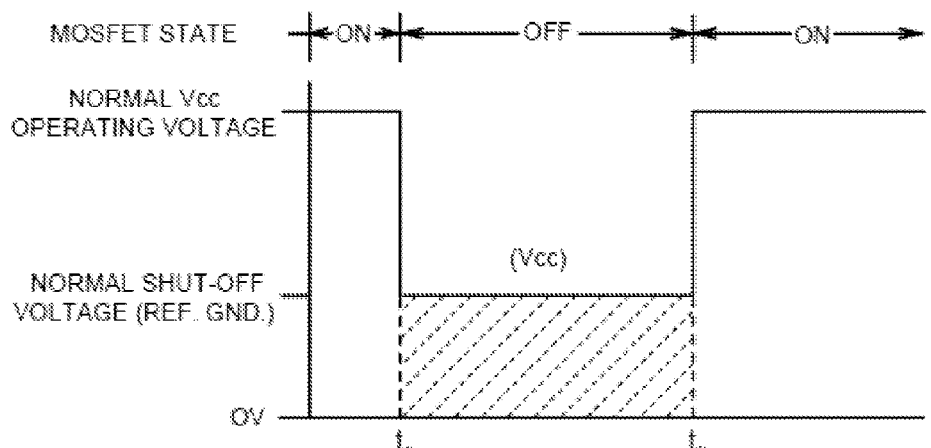
FIG. 1c is a plot of potential available for the prior art n-channel high side switch in the event of temporary supply voltage drop out.

FIG. 1b illustrates the function for the prior art configuration (shown in FIG. 1a) in the case of a lasting voltage dropout. Supply voltage quickly falls below the undervoltage threshold, and the switch will turn off. This event is signaled by the dotted shutoff line, which spans the shaded area that represents the voltage supplied to the charge pump.

Figure 2B:
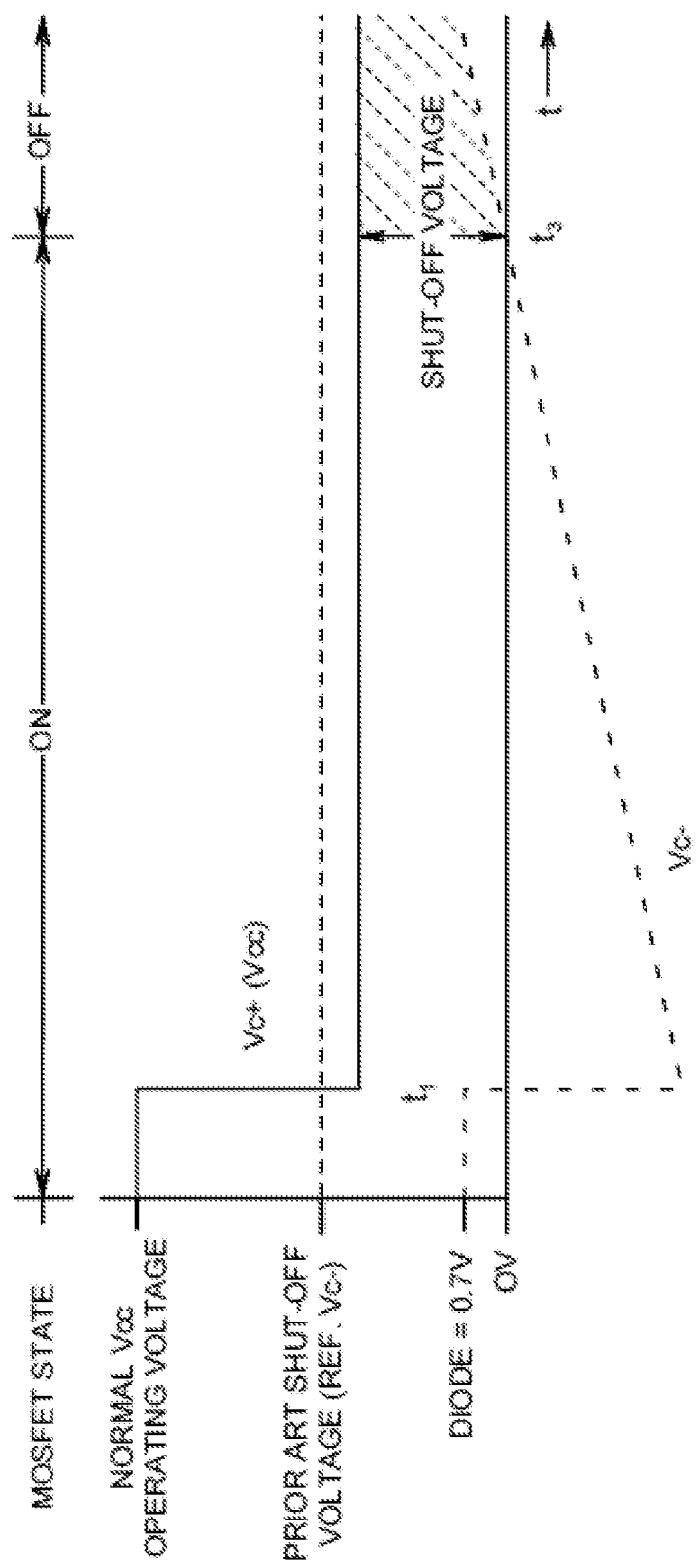
FIG. 2b is a plot of potential available for the improved n-channel high side switch in the event of a lasting supply voltage drop out.

FIG. 2b displays the function for the improved high side switch IC (shown in FIG. 2a) in the case of a lasting voltage dropout of Vcc occurring at time t1. The voltage at the charge pump, represented by the vertical span of the shaded area, is slowly reduced depending on the current flow I(t) of the charge pump and the size of the capacitor C1. Note that the initial voltage of the charge pump is slightly lower than that shown in FIG. 1b. This is because of the forward diode voltage (normally about 0.7V) raised about ground potential. In FIG. 2b, at time t3, the MOSFET shuts OFF.

Figure 2C:
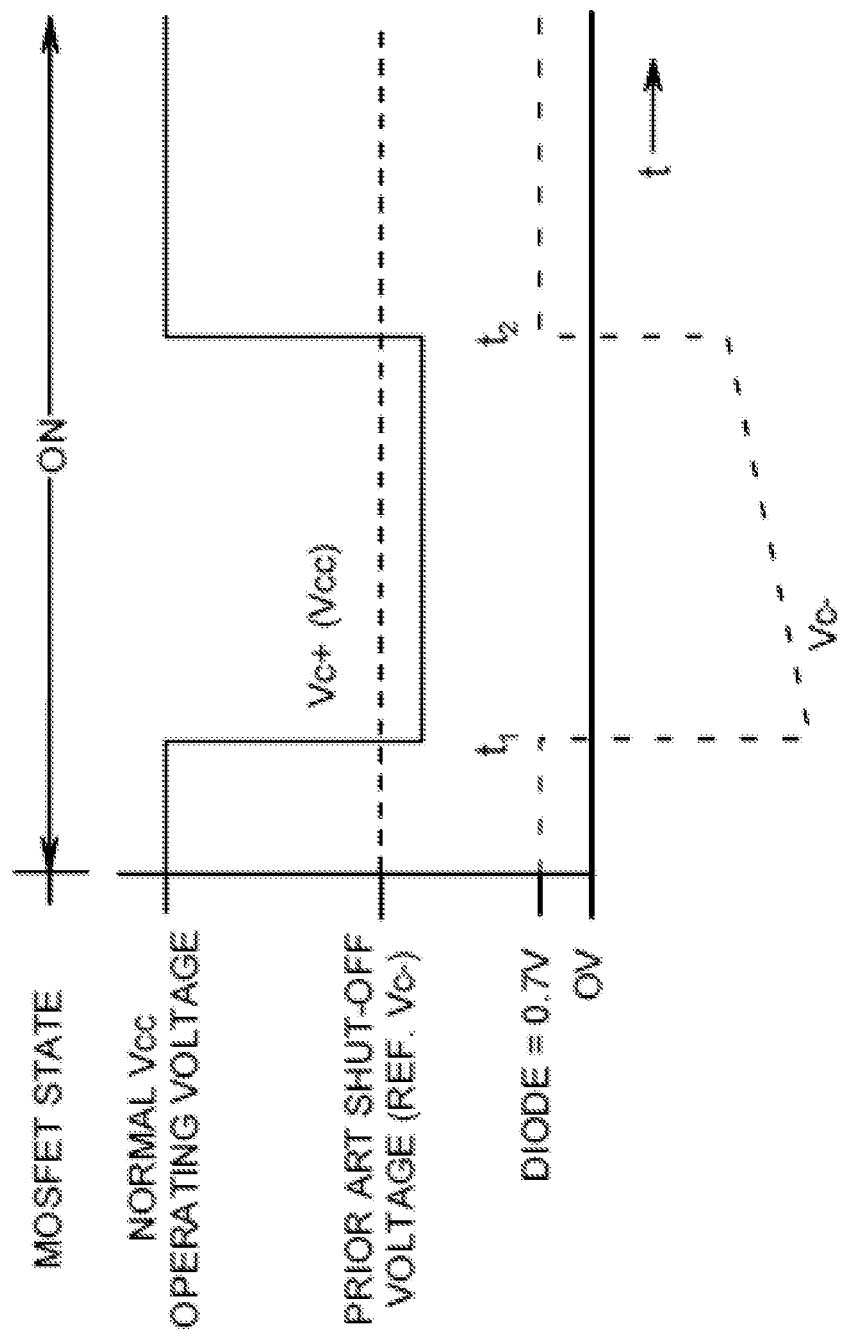
FIG. 2c is a plot of potential available for the improved n-channel high side switch in the event of temporary supply voltage drop out.

FIG. 2c displays the operation for the improved high side switch IC in the case of a momentary voltage dropout, occurring between time t1 and t2. While Vc− is rising during the dropout, the supply has a chance to recover before the span between Vc+ and Vc− would reach the shutoff length (at time t3), as it did in FIG. 2b. Thus, the MOSFET stays ON for the entire voltage dropout between t1 and t2. If the capacitor is large enough, this should be the case for all expected voltage dropouts.

The principle and mode of operation of this invention have been explained and illustrated in its preferred embodiment. However, it must be understood that this invention may be practiced otherwise than as specifically explained and illustrated without departing from its spirit or scope.

The invention claimed is:

1. A circuit arrangement for selectively providing an electrical connection between a power supply and a load comprising:
   a power supply;
   a load;
   a semiconductor switch including an input connected to the power supply, an output connected to the load, and a control input such that when a signal applied to the control input is above a threshold, the semiconductor switch is operated in a closed condition and an electrical connection is provided between the input and the output, and such that when the signal applied to the control input is below the threshold, the semiconductor switch is operated in an opened condition and an electrical connection is not provided between the input and the output;
   a charge pump that receives power from the power supply and generates the signal to the control input of the semiconductor switch whenever the power received from the power supply is above a threshold, the charge pump including a ground connection;
   a diode connected between the ground connection of the charge pump and a circuit ground; and
   a capacitor connected between the power supply and the ground connection of the charge pump,
   wherein the diode and capacitor cause the charge pump to continue to generate the signal to the control input of the semiconductor switch for a predetermined amount of time after the power received from the power supply falls below the threshold.

2. The circuit arrangement defined in claim 1 wherein the semiconductor switch is a field effect transistor.

3. The circuit arrangement defined in claim 2 wherein the semiconductor switch and the charge pump are integrated in a controller integrated circuit.

4. The circuit arrangement defined in claim 2 wherein the charge pump generates the signal to a control logic circuit, and wherein the control logic circuit is connected to the control input of the semiconductor switch.

5. The circuit arrangement defined in claim 4 wherein the semiconductor switch, the charge pump, and the control logic circuit are integrated in a controller integrated circuit.

* * * * *